United States Patent
Kang et al.

(10) Patent No.: US 10,157,164 B2
(45) Date of Patent: Dec. 18, 2018

(54) HIERARCHICAL SYNTHESIS OF COMPUTER MACHINE INSTRUCTIONS

(71) Applicant: QUALCOMM Incorporated, San Diego, CA (US)

(72) Inventors: Sangyeol Kang, San Diego, CA (US); Ovidiu Cristian Miclea, San Diego, CA (US); Stephen Michael Verrall, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/270,721

(22) Filed: Sep. 20, 2016

(65) Prior Publication Data

US 2018/0081656 A1    Mar. 22, 2018

(51) Int. Cl.
*G06F 9/30*          (2018.01)
*G06F 9/445*         (2018.01)
(Continued)

(52) U.S. Cl.
CPC ............... *G06F 15/00* (2013.01); *G06F 9/30* (2013.01); *G06F 17/50* (2013.01);
(Continued)

(58) Field of Classification Search
CPC ............... G06F 9/3005; G06F 9/30134; G06F 9/30152; G06F 9/30076; G06F 9/30145;
(Continued)

(56) References Cited

U.S. PATENT DOCUMENTS 5,051,940 A * 9/1991 Vassiliadis ............... G06F 7/575
                                                  708/524
5,197,135 A * 3/1993 Eickemeyer ........ G06F 9/30152
                                                  712/215

(Continued)

FOREIGN PATENT DOCUMENTS

WO         03073270 A1    9/2003

OTHER PUBLICATIONS

Peter M. Athanas et al., Processor Reconfiguration Through Instruction-Set Matamorphosis, Mar. 1993 IEEE, [Retrieved on Sep. 4, 2018]. Retrieved from the internet: <URL: https://ieeexplore.ieee.org/stamp/stamp.jsp?tp=&arnumber=204677> 7 Pages (11-17) ( Year: 1993).*

(Continued)

*Primary Examiner* — Anibal Rivera
(74) *Attorney, Agent, or Firm* — Patterson & Sheridan, LLP

(57) ABSTRACT

Aspects disclosed herein relate to aggregating functionality of computer machine instructions to generate additional computer machine instructions and including the additional computer machine instructions in an instruction set architecture (ISA). An exemplary method includes selecting at least first and second computer machine instructions from an instruction set, aggregating functionality of the first and second computer machine instructions to generate a third computer machine instruction, and adding the third computer machine instruction to the instruction set.

30 Claims, 5 Drawing Sheets

(51) Int. Cl.
*G06F 9/318* (2018.01)
*G06F 9/38* (2018.01)
*G06F 15/00* (2006.01)
*G06F 17/50* (2006.01)
*G06F 8/41* (2018.01)

(52) U.S. Cl.
CPC .......... *G06F 17/5045* (2013.01); *G06F 8/443* (2013.01); *G06F 8/4434* (2013.01); *G06F 8/451* (2013.01)

(58) Field of Classification Search
CPC .. G06F 9/30189; G06F 9/3004; G06F 9/3017; G06F 9/30174; G06F 9/301; G06F 9/30079; G06F 9/30181; G06F 9/30149; G06F 9/30014; G06F 9/355; G06F 9/30018; G06F 9/3804; G06F 9/30; G06F 8/443; G06F 8/66; G06F 8/451; G06F 8/4441; G06F 8/52; G06F 8/4434; G07F 17/5045
See application file for complete search history.

(56) References Cited

U.S. PATENT DOCUMENTS

| | | | | |
|---|---|---|---|---|
| 5,287,467 A * | 2/1994 | Blaner | G06F 9/383 | 712/235 |
| 5,295,249 A * | 3/1994 | Blaner | G06F 9/30152 | 712/213 |
| 5,301,341 A * | 4/1994 | Vassiliadis | G06F 7/575 | 708/709 |
| 5,303,356 A * | 4/1994 | Vassiliadis | G06F 9/30152 | 712/214 |
| 5,438,668 A * | 8/1995 | Coon | C10G 1/00 | 712/204 |
| 5,448,746 A * | 9/1995 | Eickemeyer | G06F 9/30149 | 712/210 |
| 5,471,593 A * | 11/1995 | Branigin | G06F 9/30018 | 712/219 |
| 5,504,932 A * | 4/1996 | Vassiliadis | G06F 9/30149 | 712/208 |
| 5,680,568 A * | 10/1997 | Sakamura | G06F 9/355 | 711/214 |
| 5,680,637 A * | 10/1997 | Hotta | G06F 9/30079 | 712/206 |
| 5,732,234 A * | 3/1998 | Vassiliadis | G06F 9/3017 | 712/200 |
| 5,819,067 A * | 10/1998 | Lynch | G06F 8/52 | 703/22 |
| 5,832,249 A * | 11/1998 | Tran | G06F 9/30152 | 712/204 |
| 5,854,913 A * | 12/1998 | Goetz | G06F 9/30174 | 712/210 |
| 5,974,531 A * | 10/1999 | Shang | G06F 9/3004 | 712/202 |
| 6,101,592 A | 8/2000 | Pechanek et al. | | |
| 6,253,314 B1 * | 6/2001 | Itoh | G06F 9/30181 | 712/209 |
| 6,282,633 B1 * | 8/2001 | Killian | G06F 9/30145 | 712/208 |
| 6,292,881 B1 * | 9/2001 | Tanaka | G06F 9/3017 | 712/210 |
| 6,438,679 B1 * | 8/2002 | Sollars | G06F 9/30134 | 712/208 |
| 6,477,683 B1 * | 11/2002 | Killian | G06F 17/5045 | 716/104 |
| 6,941,548 B2 * | 9/2005 | Goodwin | G06F 8/443 | 717/151 |
| 7,278,137 B1 * | 10/2007 | Fuhler | G06F 8/4434 | 717/151 |
| 7,493,474 B1 * | 2/2009 | Pechanek | G06F 9/30014 | 712/209 |
| 7,747,992 B2 * | 6/2010 | Peri | G06F 8/443 | 717/151 |
| 7,873,814 B1 * | 1/2011 | Cohen | G06F 9/30134 | 712/209 |
| 7,962,725 B2 * | 6/2011 | Smith | G06F 9/30152 | 712/210 |
| 8,402,257 B2 * | 3/2013 | Ferren | G06F 8/443 | 712/227 |
| 8,875,068 B2 | 10/2014 | Killian et al. | | |
| 8,880,851 B2 * | 11/2014 | Henry | G06F 9/30076 | 712/200 |
| 9,436,450 B2 * | 9/2016 | Oprea | G06F 8/4441 | |
| 9,535,699 B2 * | 1/2017 | Ochi | G06F 9/30189 | |
| 2003/0167460 A1 * | 9/2003 | Desai | G06F 1/3228 | 717/151 |
| 2004/0205322 A1 * | 10/2004 | Shelor | G06F 9/30145 | 712/209 |
| 2005/0166038 A1 * | 7/2005 | Wang | G06F 9/30145 | 712/226 |
| 2005/0278713 A1 | 12/2005 | Goodwin et al. | | |
| 2006/0242385 A1 * | 10/2006 | Murakami | G06F 9/30145 | 712/200 |
| 2007/0050603 A1 * | 3/2007 | Vorbach | G06F 9/30181 | 712/221 |
| 2010/0153654 A1 * | 6/2010 | Vorbach | G06F 12/0862 | 711/137 |
| 2012/0102302 A1 * | 4/2012 | Bansal | G06F 9/3804 | 712/234 |
| 2012/0260067 A1 * | 10/2012 | Henry | G06F 9/30076 | 712/200 |
| 2013/0085806 A1 * | 4/2013 | Rothschild | G06Q 30/0203 | 705/7.32 |
| 2014/0244983 A1 * | 8/2014 | McDonald | G06F 9/3005 | 712/225 |
| 2014/0372727 A1 | 12/2014 | Valentine et al. | | |
| 2014/0380021 A1 * | 12/2014 | Ochi | G06F 9/30189 | 712/208 |
| 2015/0220315 A1 * | 8/2015 | Chiba | G06F 9/30145 | 717/149 |
| 2016/0062751 A1 * | 3/2016 | Oprea | G06F 8/4441 | 717/152 |
| 2017/0039056 A1 * | 2/2017 | Ninos | G06F 8/66 | |
| 2017/0123775 A1 * | 5/2017 | Xu | G06F 8/451 | |
| 2018/0107489 A1 * | 4/2018 | Gao | G06F 9/30 | |

OTHER PUBLICATIONS

Samuel Larsen et al., Exploiting superword level parallelism with multimedia instruction sets, Jun. 18-21, 2000, [Retrieved on Sep. 4, 2018]. Retrieved from the internet: <URL: https://dl.acm.org/citation.cfm?id=349320> 12 Pages (145-156) (Year: 2000).*
International Search Report and Written Opinion—PCT/US2017/048001—ISA/EPO—dated Nov. 28, 2017.

* cited by examiner

HIERARCHICAL SYNTHESIS OF COMPUTER MACHINE INSTRUCTIONS

BACKGROUND

Aspects disclosed herein relate to the field of computer processors. More specifically, aspects disclosed herein relate to aggregating functionality of computer machine instructions to generate additional computer machine instructions and including the additional computer machine instructions in an instruction set architecture (ISA).

When defining a new computing machine, instructions for inclusion in an ISA of the computing machine are defined. Operations supported by (to be performed by) the computing machine are important to the process of defining an ISA for the computing machine, and the operations supported by the computing machine potentially become instructions of the computing machine.

An instruction set of an already existing processor ISA may be considered as a possible starting point (e.g., with additional instructions to be added) or as a complete instruction set of the computing machine. When starting with an already existing instruction set, it may be difficult to determine which instructions of the instruction set are useful for performing operations of the new computing machine. While many instruction sets already exist, each instruction set is designed for a particular processor architecture, and there is no guarantee that instruction "granules" (e.g., of an existing instruction set) that are good for an existing computing machine are also good for the operations of a new computing machine. For example, an Intel® X86 (e.g., 80486, Pentium®) instruction set may not be good for a newly designed 8-bit digital signal processor (DSP).

Therefore, techniques for creating instruction sets for new computing machines are desirable.

SUMMARY

Aspects disclosed herein relate to aggregating functionality of computer machine instructions to generate additional computer machine instructions and including the additional computer machine instructions in an instruction set architecture (ISA).

In one aspect, a method is provided. The method generally includes selecting at least first and second computer machine instructions from an instruction set, aggregating functionality of the first and second computer machine instructions to generate a third computer machine instruction, and adding the third computer machine instruction to the instruction set.

In another aspect, an apparatus is provided. The apparatus generally includes a processor configured to select at least first and second computer machine instructions from an instruction set, to aggregate functionality of the first and second computer machine instructions to generate a third computer machine instruction, and to add the third computer machine instruction to the instruction set; and a memory.

In still another aspect, an apparatus is provided. The apparatus generally includes means for selecting at least first and second computer machine instructions from an instruction set, means for aggregating functionality of the first and second computer machine instructions to generate a third computer machine instruction, and means for adding the third computer machine instruction to the instruction set.

The claimed aspects may provide one or more advantages over previously known solutions. According to some aspects, software may be executed more efficiently on processors designed using the disclosed methods.

BRIEF DESCRIPTION OF THE SEVERAL VIEWS OF THE DRAWINGS

So that the manner in which the above recited aspects are attained and can be understood in detail, a more particular description of aspects of the disclosure, briefly summarized above, may be had by reference to the appended drawings.

It is to be noted, however, that the appended drawings illustrate only aspects of this disclosure and are therefore not to be considered limiting of its scope, for the disclosure may admit to other aspects.

FIG. 3A illustrates an exemplary ALU according to previously known techniques, and FIG. 3B illustrates an exemplary ALU according to aspects of the present disclosure.

DETAILED DESCRIPTION

Aspects disclosed herein provide techniques for synthesizing (e.g., generating) computer machine instructions. The synthesized computer machine instructions may be included in an instruction set architecture (ISA). According to aspects of the present disclosure, a kind of instruction algebra form may be defined. The instruction algebra form may include basic instructions and compound instructions. Basic instructions are atomic and may be the finest "granule" of instructions included in an ISA. Compound instructions may be synthesized by aggregating at least two instructions that may be referred to as component instructions. Component instructions of a compound instruction may be basic instructions and/or compound instructions. The form for the instructions may include descriptions of inputs and outputs of the instructions. Inputs may be described as internal inputs and external inputs. External inputs may be obtained by an instruction (e.g., a compound instruction) from sources outside of the instruction definition. Internal inputs may be obtained by a component instruction of a compound instruction from another component instruction of the compound instruction. Outputs may be described as effective outputs and silent outputs. Effective outputs of an instruction may be "consumed" (e.g., taken as an input) by some other instruction(s). Silent outputs may be generated by an instruction but never consumed.

According to aspects of the present disclosure, a technique for translating operations from a first type of instruction set (e.g., instructions in C) to a second type of instruction set (e.g., Advanced reduced instruction set computing (RISC) Machine (ARM) instructions) is provided. In the provided technique, instruction templates that describe operations written for a first type of instruction set are determined. Operations written for a second type of instruction set, which may also be described by the determined instruction templates, are then determined. Because the operations written for the first type of instruction set and the operations written for the second type of instruction set can both be described by the instruction templates, the operations written for the second type of instruction set are equivalent to the operations written for the first type of instruction set. Thus, the operations written for the second type of instruction set may be considered a translation of the operations written for the first type of instruction set.

Figure 1:
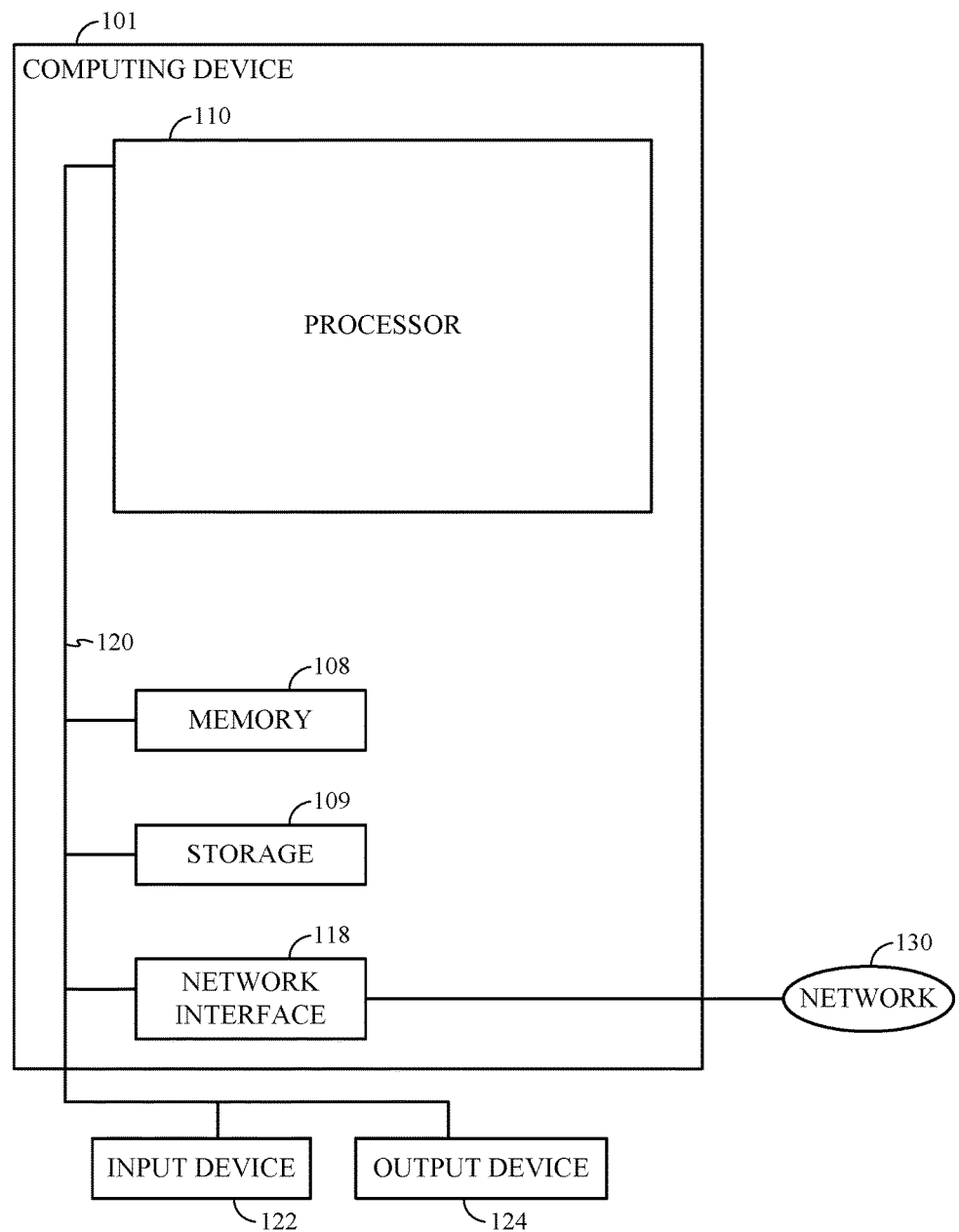
FIG. 1 is a functional block diagram of an exemplary computing device configured to operate according to aspects of the present disclosure.

FIG. 1 is a block diagram illustrating a computing device 101 configured to operate according to aspects of the present disclosure. For example, the computing device may perform operations 200, shown in FIG. 2, and/or operations 500, shown in FIG. 5. The computing device 101 may also be connected to other computing devices via a network 130. In general, the network 130 may be a telecommunications network and/or a wide area network (WAN). In a particular aspect, the network 130 is the Internet. Generally, the computing device 101 may be any type of computing device configured to synthesize computer machine instructions, including, without limitation, a desktop computer, a server, a laptop computer, and a tablet computer.

The computing device 101 generally includes a processor 110 connected via a bus 120 to a memory 108, a network interface device 118, a storage 109, an input device 122, and an output device 124. The computing device 101 generally operates according to an operating system (not shown). Any operating system supporting the functions disclosed herein may be used. The processor 101 is included to be representative of a single processor, multiple processors, a single processor having multiple processing cores, and the like. The network interface device 118 may be any type of network communications device allowing the computing device 101 to communicate with other computing devices via the network 130.

The storage 109 may be a persistent storage device. Although the storage 109 is shown as a single unit, the storage 109 may be a combination of fixed and/or removable storage devices, such as fixed disc drives, solid state drives, SAN storage, NAS storage, removable memory cards or optical storage. The memory 108 and the storage 109 may be part of one virtual address space spanning multiple primary and secondary storage devices.

The input device 122 may be any device operable to enable a user to provide input to the computing device 101. For example, the input device 122 may be a keyboard and/or a mouse. The output device 124 may be any device operable to provide output to a user of the computing device 101. For example, the output device 124 may be any conventional display screen and/or set of speakers. Although shown separately from the input device 122, the output device 124 and input device 122 may be combined. For example, a display screen with an integrated touch-screen may be a combined input device 122 and output device 124.

Figure 2:
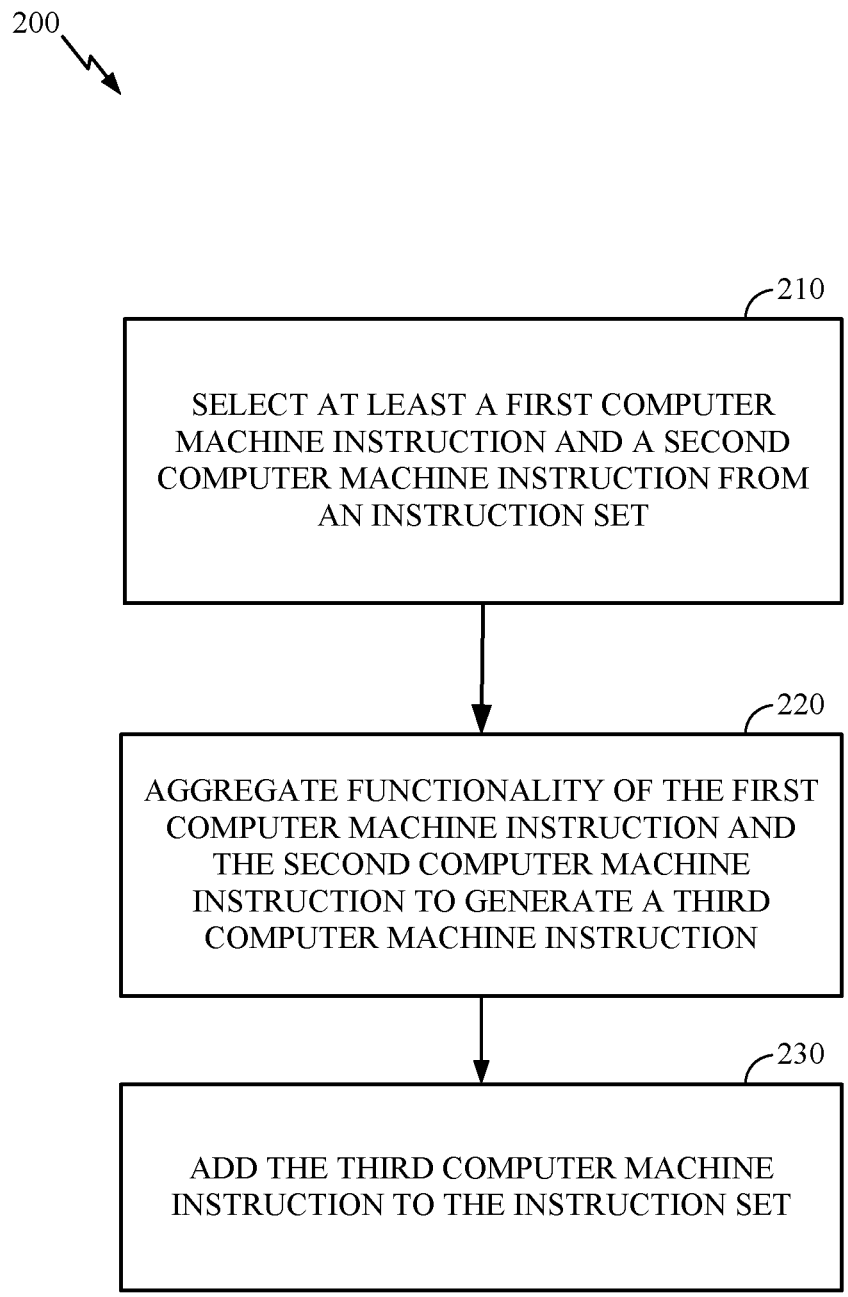
FIG. 2 is a flow chart illustrating a method for computing, according to aspects of the present disclosure.

FIG. 2 is a flow chart illustrating a method 200 for computing that may be performed by a computing device, such as computing device 101 shown in FIG. 1, according to aspects of the present disclosure. In at least one aspect, the processor 110 is used in performing the steps of the method 200. The method 200 depicts an aspect where the computing device selects instructions from an instruction set, aggregates the instructions to generate another instruction, and adds the other instruction to the instruction set, as mentioned above and described in more detail below.

At block 210, the method begins by the computing device (e.g., the processor) 101 selecting at least a first computer machine instruction and a second computer machine instruction from an instruction set. For example, the processor 110 of the computing device 101 may select the first and second computer machine instructions from the memory 108 or the storage 109 of the computing device 101.

At block 220, the method continues by the computing device 101 aggregating functionality of the first computer machine instruction and the second computer machine instruction to generate a third computer machine instruction. For example, the computing device 101 may refer to information about the first and second computer machine instructions stored in the memory 108, storage 109, and/or on the network 130.

At block 230, the method continues by the computing device 101 adding the third computer machine instruction to the instruction set. For example, the computing device 101 may add the third computer machine instruction to a data structure (e.g., a table, a database) stored in the memory 108, storage 109, and/or on the network 130, where the data structure represents a source for an instruction set architecture.

According to aspects of the present disclosure, a technique for describing instructions and associated inputs and outputs is provided. In the provided technique, an instruction (e.g., a basic instruction, a compound instruction) may be described with a template of the form:

[Name {I1, . . . , Ix} {O1, . . . , Oy}].

In the template, the first entry is the name of the instruction. The next entry, which is delineated by braces, "{ }," is a list of inputs, labeled "I1" to "Ix," expected or consumed by the instruction. The next entry in the template is also delineated by braces and is a list of outputs, "O1" to "Oy," of the instruction. An operation in a program may be described using the template of the instruction and replacing the lists of inputs and outputs with the actual inputs and outputs to be used in that operation.

According to aspects of the present disclosure, a compound instruction may be generated (e.g., synthesized) by aggregating functionality of two or more other instructions (e.g., basic instructions and other compound instructions). For example, a compound instruction may be generated by aggregating functionality of two basic instructions, three basic instructions, one basic instruction and one compound instruction, two compound instructions, or other combinations of basic and compound instructions.

According to aspects of the present disclosure, a compound instruction may be described by replacing a template for the compound instruction with the concatenated templates of the other instructions (e.g., basic instructions and compound instructions) from which the compound instruction may be generated. According to aspects of the present disclosure, when replacing a template for a compound instruction with templates of other instructions, inputs labeled with a capital "I" represent external inputs, which are inputs that are not supplied by the other instructions. According to aspects of the present disclosure, when replacing a template for a compound instruction with templates of other instructions, inputs labeled with a first portion with a lower-case "i" and a first number represent internal inputs, which are inputs supplied by one of the other instructions. The first number identifies which other instruction is being referred to. These internal input labels also include a period "." and a second portion with a lower-case "o" and a second number that indicates which output of the other instruction is to be used. When instructions are selected for synthesizing a compound instruction, one criterion used in the selection is that outputs of a first instruction that are to be used as inputs for a second instruction must be suitable (e.g., of the expected type) for use as inputs to the second instruction. When replacing a template for a compound instruction with templates of other instructions, outputs labeled with a lower-case "o" represent outputs of an instruction that are not outputs of the compound instruction (i.e., they are not available outside of the compound instruction). For example, a compound instruction may be generated by aggregating functionality of two basic instructions. In the example, the compound instruction "compound" may be described using this template: [compound1 {I1, I2} {O1}]. Still in the example, the two basic instructions, "basic1" and "basic2," may be described using these templates:

[basic1 {I1} {O1}] and
[basic2 {I1, I2} {O1}].

In this example, the output of the compound instruction may be the output of the basic2 instruction when the first input of the compound instruction is used as the input of the basic1 instruction, the output of the basic1 instruction is used as the first input of the basic2 instruction, and the second input of the compound instruction is used as the second input of the basic2 instruction. Thus, in this example, the compound instruction may be described by replacing the template of the compound instruction with the concatenated templates of the basic1 and basic2 instructions in this manner:

[compound1 {I1, I2} {O1}]==[basic1 {I1} {o1}] [basic2 {i1.o1, I2} {O1}]

Still in the example, the output of the basic1 instruction is represented with a lower-case "o" because it is not made available outside of the compound1 instruction. Also in the example, the first input of the basic2 instruction is represented "i1.o1," because the basic2 instruction takes the first output, o1, of the first instruction, i1 (the basic1 instruction), as a first input. Meanwhile, the basic1 instruction takes the first input, I1, of the compound instruction as an input, and the basic2 instruction takes the second input, I2, of the compound instruction as a second input.

In a second example that builds on the first example above, a second compound instruction "compound2" may be described using this template:

[compound2 {I1, I2} {O1}].

In the example, the compound instruction may be generated from the first compound instruction "compound1", described above, and a basic instruction "basic3." The basic3 instruction may be described with the template:

[basic3 {I1} {O1}].

The output of the second compound instruction may be the output of the first compound instruction when the output of the basic3 instruction is used as the first input of the first compound instruction. The compound2 instruction may then be described by replacing the template of the compound2 instruction with the templates of the compound1 instruction and the basic3 instruction in this manner:

[compound2 {I1, I2} {O1}]==[basic3 {I1} {o1}] [compound1 {i1.o1, I2} {O1}]

Continuing with this example, the template of the compound1 instruction may then be replaced as described above, with the final result being:

[compound2 {I1, I2} {O1}]==[basic3 {I1} {o1}] [basic1 {i1.o1} {o1}] [basic2 {i2.o1, I2} {O1}]

Because the basic1 instruction is the second instruction in the concatenation, the output of the basic1 instruction, when used as an input in the basic2 instruction, is represented with "i2.o1."

According to aspects of the present disclosure, a first compound instruction may be generated from a second instruction that may generate a plurality of outputs. Outputs of the second instruction that are consumed (e.g., used as inputs) by another instruction or output by the compound instruction may be referred to as "effective outputs." In contrast, outputs of the second instruction that are not used (e.g., consumed, taken as inputs) by the other instructions nor output by the compound instruction may be referred to as "silent outputs." For example, a first basic instruction, basic1, may be represented by this template:

[basic1 {I1, I2} {O1, O2}].

In the example, a second basic instruction, basic2, may be represented by this template:

[basic2 {I1, I2} {O1, O2}].

Still in the example, a third basic instruction, basic3, may be represented by this template:

[basic3 {I1} {O1}]

In the example, a compound instruction, compound, may be represented by this template:

[compound {I1, I2, I3, I4} {O1, O2}].

Continuing the example, the compound instruction may be generated from the basic1, basic2, and basic3 instructions, with some of the outputs of the basic1 and basic2 instructions being effective outputs and others being silent outputs, according to this template:

[compound {I1, I2, I3, I4} {O1, O1}]==[basic1 {I1, I2} {o1, o2}] [basic2 {i1.o1, I3} {o1, O2}] [basic3 {I4} {O1}]

According to the example, the second output of the basic1 instruction is not used by the other instructions or output by the compound instruction and may be referred to as a silent output. Similarly, the first output of the basic2 instruction is not used by the other instructions or output by the compound instruction and may also be referred to as a silent output. The first output of the basic1 instruction, the second output of the basic2 instruction, and the output of the basic3 instruction may be referred to as effective outputs.

An example of a technique to add an instruction to an exemplary instruction set (e.g., in an exemplary ISA), in accordance with aspects of the present disclosure, may be described using the following example. The exemplary instruction set may include a basic instruction "add." The add instruction may accept two inputs, add the two inputs to generate a sum, and output the sum. According to aspects of the present disclosure, the add instruction may be described with the following exemplary instruction template:

[add {I1, I2} {O1}].

In the template, the name of the instruction, "add," is the first entry, as described above. In the exemplary add instruction template, there are two inputs that are labeled "I1" and "I2," again as described above. In the exemplary add instruction template, there is one output labeled "O1," as described above. For example, if, in an operation in an exemplary program, the contents of two registers "r1" and "r2" are to be added and the sum is to be stored in a third register "r3," then that operation may be described as:

[add {r1, r2} {r3}].

Continuing the example above, the instruction set may include an additional basic operation "const_1." The const_1 instruction may provide a constant with a value of one. That is, the const_1 instruction may represent a 1 in the program code. According to aspects of the present disclosure, the const_1 instruction may be described with the following exemplary instruction template:

[const_1 { } {O1}].

In the exemplary const_1 operation, there are no inputs, and therefore the first set of braces in the template is empty. There is one output, representing the constant 1 and labeled "O1," from the const_1 operation. The instruction set may also include a basic operation "asr." The asr operation may be an arithmetic shift right operation that shifts all of the bits of the binary representation of a first input to the right a number of times equal to a second input. That is, the asr instruction may accept two inputs, shift the bits of the first input to the right a number of times given by the second input, and output the shifted first input. According to aspects of the present disclosure, the asr instruction may be described with the following instruction template:

[asr {I1, I2} {O1}].

Continuing the example above, an instruction "div2" may be desired to be added to the instruction set. The instruction div2 may be intended to accept an input, divide the input by two (rounding down), and output the divided input. According to aspects of the present disclosure, the div2 instruction may be described with the following exemplary instruction template:

[div2 {I1} {O1}].

The div2 instruction may be a compound instruction that is a concatenation of the const_1 and the asr instructions. That is, the div2 can be expanded into the two basic instructions, const_1 and asr. Because the div2 can be expanded into the two basic instructions, the template of the div2 instruction can be replaced by templates of the const_1 and asr instructions in the following manner:

[div2 {I1} {O1}]=[const_1 { } {o1}] [asr {I1, i1.o1} {O1}].

The div2 instruction may then be added to the instruction set. If, in an operation in an exemplary program, the contents of a register "r0" are to be divided by two, rounded down, and stored in a register "r1", then that operation may be described as:

[div2 {r0} {r1}].

That operation may also be described by replacing the div2 template with the templates of the const_1 and asr instructions, as described above. The operation would then be described as:

[const_1{ } {o1}] [asr {r0, i1.o1} {r1}].

Another example of adding an instruction to the exemplary instruction set may be described using the following example. An instruction "avg" that calculates the average of two inputs and outputs that average may be desired. According to aspects of the present disclosure, the avg instruction may be described with the following exemplary instruction template:

[avg {I1, I2} {O1}].

Calculating an average of two inputs may be shown to be equivalent to adding the two inputs and then dividing the sum by two. Thus, the template of the avg instruction may be replaced by the templates of the add and div2 instructions, according to this relationship:

[avg {I1, I2} {O1}]=[add {I1, I2} {o1}] [div2 {i1.o1} {O1}].

As described previously, the template of the div2 instruction can be replaced by the templates of the const_1 and asr instructions, according to this relationship:

[div2 {I1} {O1}]=[const_1 { } {o1}] [asr {I1, i1.o1} {O1}].

The avg operation may then be added to the instruction set. If, in an operation in an exemplary program, an average of the contents of two registers, r1 and r2, is to be calculated and stored in a third register, r3, that operation may be described as:

[avg {r1, r2} {r3}].

Because the avg instruction template can be replaced with the templates of other instructions, as described above, the operation can also be described as:

[add {r1, r2} {o1}] [const_1 { } {o1}] [asr {i1.o1, i2.o1} {r3}].

Figure 3A:
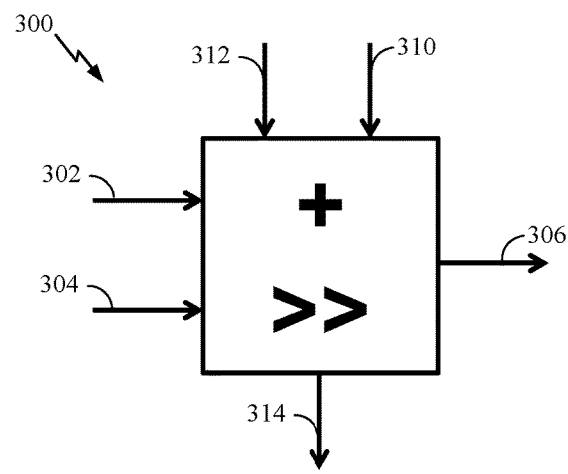
FIGS. 3A and 3B illustrate exemplary arithmetic logic units (ALUs).

FIG. 3A illustrates a functional block diagram of an exemplary arithmetic logic unit 300 (ALU), according to previously known techniques. The ALU may be included in the processor 110 shown in FIG. 1 or the processor 401 shown in FIG. 4, described below. The exemplary ALU is configured to perform an "add" (+) function and an "arithmetic shift right" (>>) function. The exemplary ALU accepts two operands at inputs 302 and 304 and produces a result that is output at 306. In addition, the exemplary ALU accepts an opcode at input 310 and may accept a status at input 312. The exemplary ALU may produce a status at output 314. The operands are the data which are the inputs for the function to be performed by the ALU. The result is the data determined by performing a selected operation on the operands. The opcode specifies the desired arithmetic or logic operation to be performed by the ALU. In the exemplary ALU, the opcode specifies whether the ALU is to perform the add function or the arithmetic shift right function. The status received on input 312 may represent a status from another operation, such as an indication of a carry in an addition operation or an error in some other operation. The status that may be produced at output 314 may represent a status determined while performing an operation by the ALU, such as a carry from the add function or a bit shifted out of the result during the arithmetic shift right operation. For example, if a program instruction was to add the value of register 1 to the value of register 2 and store the result in register 3, then the value of register 1 could be passed to the ALU on input 302 and the value of register 2 could be passed to the ALU on input 304. Continuing the example, control logic of a CPU would supply an opcode on input 310 indicating that the ALU is to perform the add function on the two operands. Still in the example, the result of adding the operands would be passed on, output 306, into register 3.

In a second example, if a program instruction was to shift the value of register 3 one place to the right and store the result in register 4, then the value of register 3 would be passed to the ALU on input 302 and the value of one, indicating that the other operand should be shifted right once, would be passed to the ALU on input 304. Continuing the example, control logic of a CPU would supply an opcode on input 310 indicating that the ALU is to perform the arithmetic shift right (asr) function using the two operands. Still in the example, the result of shifting the value of register 3 one place to the right would be passed, on output 306, into register 4.

As discussed previously, a function "avg" to determine an average of two numbers may be constructed from an add function and an arithmetic shift right function. First, the two numbers are added using the add function, and then the result of the add function is shifted one place to the right. In the exemplary ALU 300 described above, To implement the avg function, a processor including the exemplary ALU 300 may cause the ALU to execute two separate instructions, namely, an add followed by an asr. The two instructions can be executed back-to-back or in another manner, depending on the processor's instruction scheduling scheme.

Figure 3B:
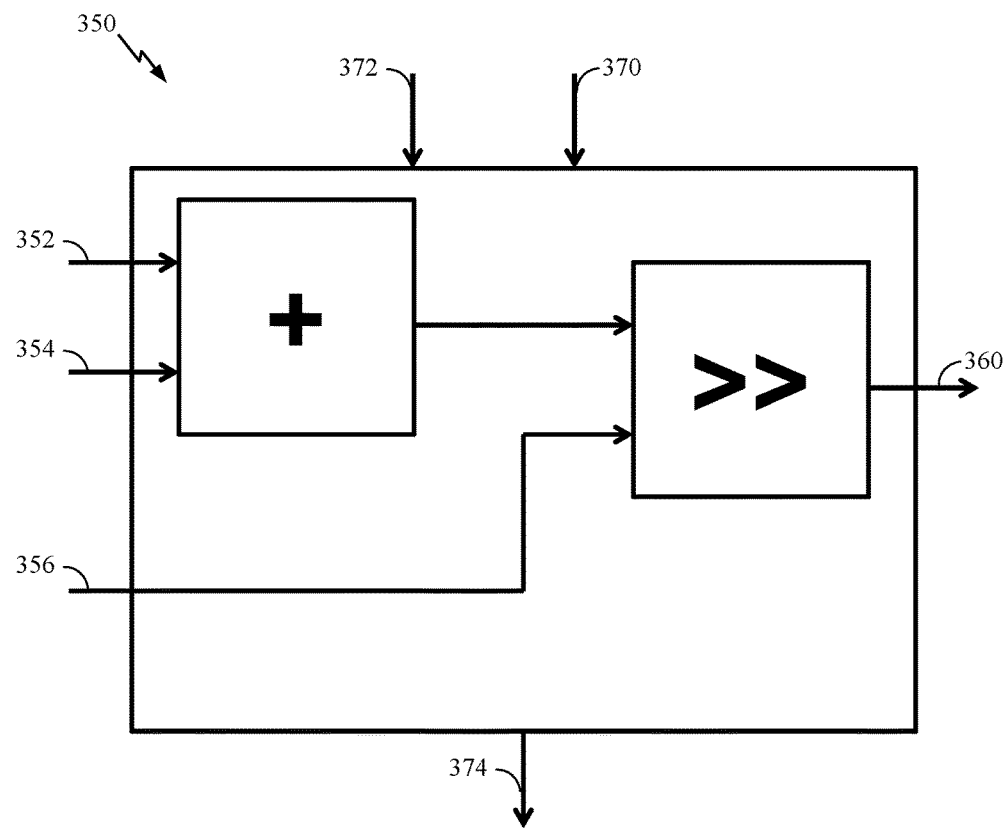

FIG. 3B illustrates a functional block diagram of an exemplary arithmetic logic unit 350 (ALU), according to aspects of the present disclosure. The ALU may be included in the processor 110 shown in FIG. 1 or the processor 401 shown in FIG. 4, described below. The exemplary ALU is configured to perform an "add" (+) function, an "arithmetic shift right" (>>) function, and an averaging (+>>) function, called "avg." The exemplary ALU accepts up to three operands at inputs 352, 354, and 356. The exemplary ALU also produces a result that is output at 360. In addition, the exemplary ALU accepts an opcode at input 370 and may accept a status at input 372. The exemplary ALU may produce a status at output 374. The operands are the inputs for the function to be performed by the ALU, and the result is the data determined by performing a selected operation on the operands. The opcode specifies the desired arithmetic or logic operation to be performed by the ALU. In the exemplary ALU, the opcode specifies whether the ALU is to perform the add function, the arithmetic shift right (asr) function, or the avg function. The status received on input 372 may represent a status from another operation, such as an indication of a carry in an addition operation or an error in some other operation. The status that may be produced at output 374 may represent a status determined while performing an operation by the ALU, such as a carry from the add function or a bit shifted out of the result by the asr function.

For example, if a program instruction was to add the value of register 1 to the value of register 2 and store the result in register 3, then the value of register 1 could be passed to the ALU on input 352 and the value of register 2 could be passed to the ALU on input 354. Continuing the example, control logic of a CPU would supply an opcode on input 370 indicating that the ALU is to perform the add function on the two operands. In the example, any signal on input 356 may be ignored by the ALU, or set to zero by the ALU, based on the opcode indicating that the ALU is to perform the add function. Still in the example, the result of adding the operands would be passed to the asr function. Continuing the example, the asr function would not change that result, due to the operand on 356 being ignored or set to zero. In the example, the asr function would pass the unchanged result of the add function, on output 360, into register 3.

In a second example, if a program instruction was to shift the value of register 3 one place to the right and store the result in register 4, then the value of register 3 would be passed to the ALU on input 352 and the value of one, indicating that the an operand should be shifted right once, would be passed to the ALU on input 356. Any signal on input 354 may be ignored by the ALU, or set to zero by the ALU, based on the opcode indicating that the ALU is to perform the asr function. Continuing the example, control logic of a CPU would supply an opcode on input 370 indicating that the ALU is to perform the asr function using the two operands. In the example, the add function would pass the operand from input 352 unchanged to the asr function, because the operand on input 354 was ignored or set to zero. Still in the example, the unchanged operand from input 352 (i.e., the value from register 3) would be passed to the asr function. In the example, the asr function would shift the value of the operand from input 352 (i.e., the value of register 3) one place to the right and pass the result, on output 360, into register 4.

In a third example, if a program instruction was to average the value of register 1 and the value of register 2 and store the result in register 3, then the value of register 1 could be passed to the ALU on input 352 and the value of register 2 could be passed to the ALU on input 354. Continuing the example, control logic of a CPU would supply an opcode on input 370 indicating that the ALU is to perform the avg function using the two operands. Any signal on input 356 would be set to one, based on the opcode indicating that the ALU is to perform the avg function. Still in the example, the result of adding the operands on inputs 352 and 354 would be passed to the asr function. In the example, the asr function would shift the value received from the add function one place to the right, based on the signal on input 356 being set to one. Continuing the example, the result of the asr function would be passed, on output 360, into register 3. Thus, the exemplary ALU 350 may perform the avg function as a single instruction, rather than as two separate instructions as the ALU 300 performs the avg function.

Figure 4:
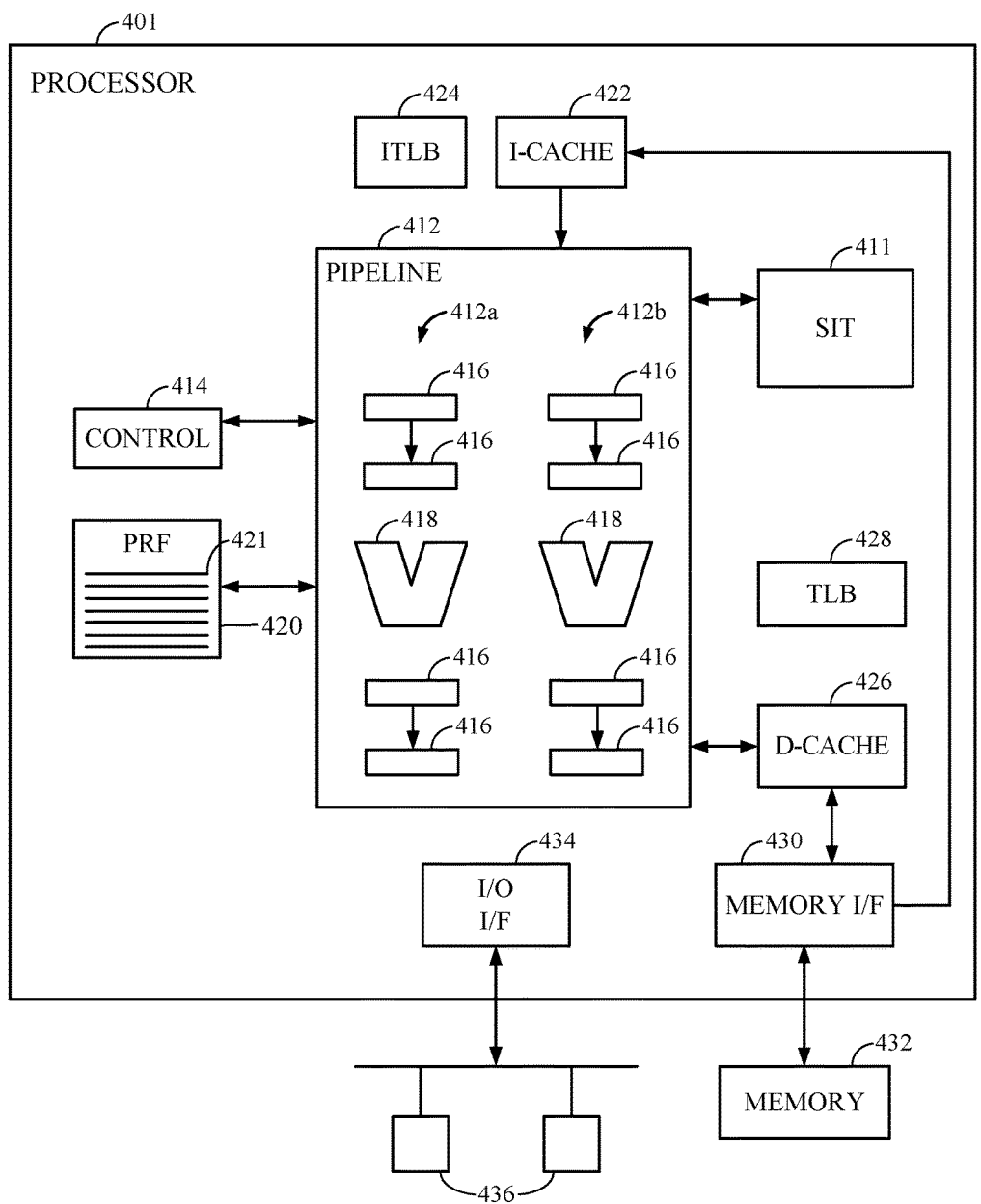
FIG. 4 is a functional block diagram of an exemplary processor configured to execute instructions of an instruction set prepared by a process according to aspects of the present disclosure.

FIG. 4 is a functional block diagram of an example processor (e.g., a CPU) 401 configured to execute instructions of an instruction set prepared by the process described in FIG. 2, according to aspects of the present disclosure. The processor 401 may be an example of the processor 110 shown in FIG. 1. Generally, the processor 401 may be used in any type of computing device including, without limitation, a server, a desktop computer, a laptop computer, a tablet computer, and a smart phone. Generally, the processor 401 may include numerous variations, and the processor 401 shown in FIG. 4 is for illustrative purposes and should not be considered limiting of the disclosure. For example, the processor 401 may be a graphics processing unit (GPU). In one aspect, the processor 401 is disposed on an integrated circuit including an instruction execution pipeline 412 and a storage instruction table (SIT) 411.

Generally, the processor 401 executes instructions in an instruction execution pipeline 412 according to control logic 414. The control logic 414 may be an embodiment of an instruction set architecture comprising an instruction set prepared by the process described in FIG. 2, according to aspects of the present disclosure. The pipeline 412 may be a superscalar design, with multiple parallel pipelines, including, without limitation, parallel pipelines 412a and 412b. The pipelines 412a, 412b include various non-architected registers (or latches) 416, organized in pipe stages, and one or more arithmetic logic units (ALU) 418, such as the exemplary ALUs illustrated in FIGS. 3A and 3B. A physical register file 420 includes a plurality of architected registers 421.

The pipelines 412a, 412b may fetch instructions from an instruction cache (I-Cache) 422, while an instruction-side translation lookaside buffer (ITLB) 424 may manage memory addressing and permissions. Data may be accessed from a data cache (D-cache) 426, while a main translation lookaside buffer (TLB) 428 may manage memory addressing and permissions. In some aspects, the ITLB 424 may be a copy of a part of the TLB 428. In other aspects, the ITLB 424 and the TLB 428 may be integrated. Similarly, in some aspects, the I-cache 422 and D-cache 426 may be integrated, or unified. Misses in the I-cache 422 and/or the D-cache 426 may cause an access to higher level caches (such as L2 or L3 cache) or main (off-chip) memory 432, which is under the control of a memory interface 430. The processor 401 may include an input/output interface (I/O IF) 434 that may control access to various peripheral devices 436.

The processor 401 may be configured to execute operations 200, shown in FIG. 2. For example, the control logic may execute a program that causes an ALU 418 to select first and second computer machine instructions from an instruction set by loading the first and second computer machine instructions from the memory 432, D-cache 426, and/or another peripheral device 436 (e.g., a disk drive). Continuing the example, the ALU 418 or another ALU 418 may aggregate functionality of the first and second computer machine instructions to generate a third computer machine instruction. Still in the example, the processor 401 may add the computer machine instruction to the instruction set by storing information regarding the third computer machine instruction in a data set (e.g., a file, a database) of information regarding the instruction set. The data set may be stored in the memory 432, D-cache 426, and/or another peripheral device 436.

According to aspects of the present disclosure, a technique for translating operations from a first type of instruction set (e.g., instructions in C) to a second type of instruction set (e.g., Advanced reduced instruction set computing (RISC) Machine (ARM) instructions) is provided. In the provided technique, instruction templates that describe operations written for a first type of instruction set are determined. Operations written for a second type of instruction set, which may also be described by the determined instruction templates, are then determined. Because the operations written for the first type of instruction set and the operations written for the second type of instruction set can both be described by the instruction templates, the operations written for the second type of instruction set are equivalent to the operations written for the first type of instruction set. Thus, the operations written for the second type of instruction set may be considered a translation of the operations written for the first type of instruction set.

Figure 5:
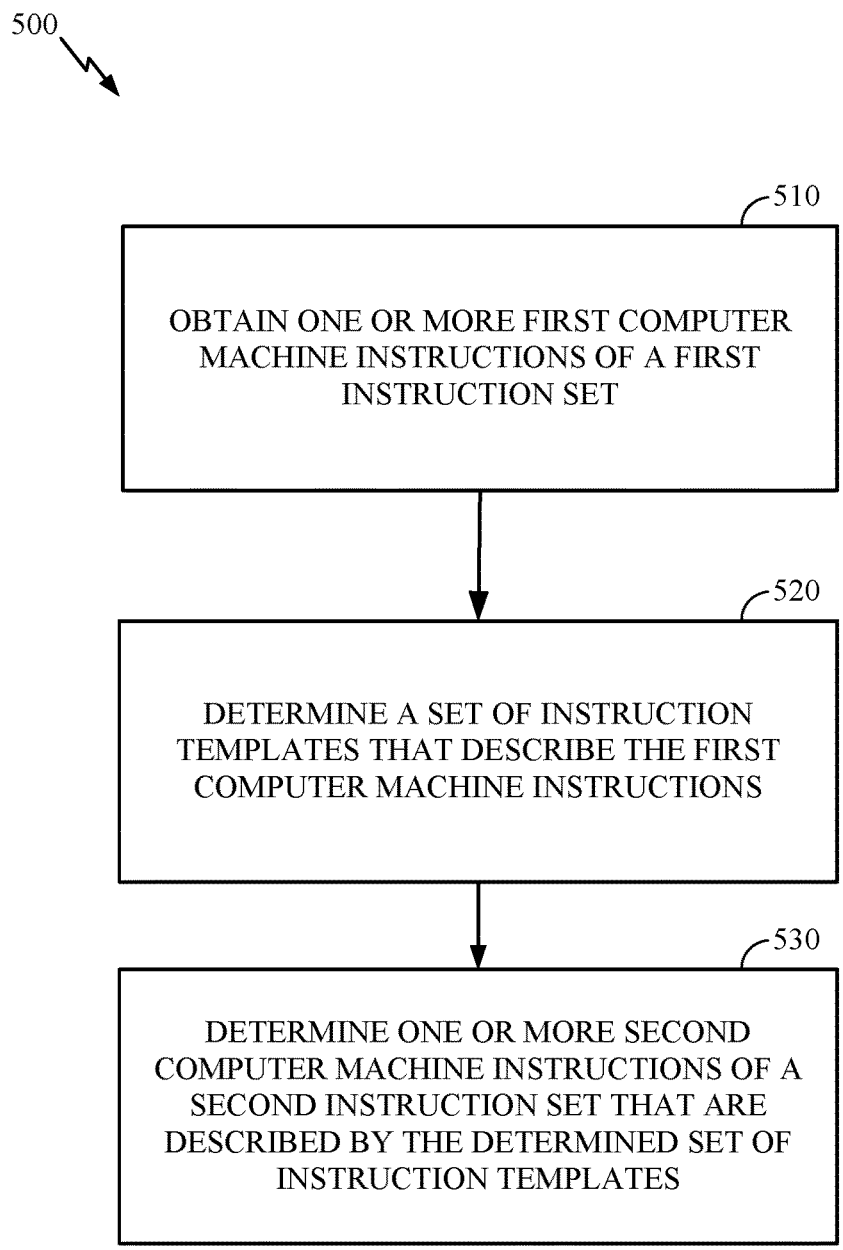
FIG. 5 is a flow chart illustrating a method for computing, according to aspects of the present disclosure.

FIG. 5 is a flow chart illustrating a method 500 for computing that may be performed by a computing device or a processor, such as computing device 101 shown in FIG. 1 or processor 401 shown in FIG. 4, according to aspects of the present disclosure. In at least one aspect, the processor 110 is used in performing the steps of the method 500. The method 500 depicts an aspect where the computing device 101 translates computer machine instructions from a first instruction set into computer machine instructions of a second instruction set.

At block 510, the method begins by the computing device 101 (e.g., the processor 110) or processor 401 obtaining one or more first computer machine instructions of a first instruction set. In a first example, the processor 110 of the computing device 101 may obtain a set of computer machine instructions from the output of an ARM compiler stored in the memory 108, stored in the storage 109, and/or provided by another device on the network 130. In a second example, an ALU 418 of the processor 401 may obtain a set of computer machine instructions from the output of an Ada compiler stored in the memory 432 or in another peripheral device 436.

At block 520, the method continues by the computing device 101 determining a set of instruction templates that describe the set of first computer machine instructions. Continuing the first example above, the processor 110 may look up instruction templates from a data set (e.g., a database, a table) of instruction templates corresponding to the set of computer machine instructions and stored in the memory 108, storage 109, and/or in another device on the network 130. Continuing the second example above, the ALU 418 or another ALU 418 may look up instruction templates from a data set (e.g., a database, a table) of instruction templates corresponding to the first computer machine instructions and stored in the memory 432 or in another peripheral device 436.

At block 530, the method continues by the computing device determining one or more second computer machine instructions of a second instruction set that are described by the determined set of instruction templates. Continuing the first example above, the processor 110 may look up computer machine instructions of a second instruction set from a data set (e.g., a database, a table) indicating computer machine instructions of the second instruction set that correspond to the instruction templates. In the first example, the data set may be obtained by the processor 110 from the memory 108, the storage 109, and/or another device on the network 130. In the second example above, an ALU 418 of the processor 401 may look up computer machine instructions of an ARM instruction set from a data set (e.g., a database, a table) indicating computer machine instructions of the ARM instruction set that correspond to the instruction templates. Still in the second example, the data set may be obtained by the ALU 418 from the memory 432 or another peripheral device 436.

For example, a program written in C may include this statement:

$$\text{int } v = (\text{int } a + \text{int } b) \gg 1.$$

That statement may be loosely interpreted as "add the values of the variables a and b, perform a one-position arithmetic shift to the right on the sum, and assign the resulting value to the variable v." An ARM compiler may compile that C statement into these ARM assembly instructions (e.g., computer machine instructions):

add r3, r1, r2
mov r3, r3, asr #1

Using the instruction templates described in previous examples, it can be shown that those ARM assembly instructions can be described with the following set of instruction templates:

[add {r1, r2} {o1}] [const_1 { } {o1}] [asr {i1.o1, i2.o1} {r3}]

Referring again to previous examples, the above instruction templates are identical to the instruction templates that describe the avg instruction. Thus, the ARM instruction set instructions may be translated to an instruction set that includes the avg instruction, possibly improving (e.g., speeding up) the execution of the program on a device that uses the instruction set that includes the avg instruction. If the format of the avg instruction is:

avg input1, input2, output then the translation of the ARM assembly instructions into instructions of the second instruction set is:

avg r1, r2, r3.

A number of aspects have been described. However, various modifications to these aspects are possible, and the principles presented herein may be applied to other aspects as well. The various tasks of such methods may be implemented as sets of instructions executable by one or more arrays of logic elements, such as microprocessors, embedded controllers, or IP cores.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. Some or all such files may be provided to fabrication handlers who configure fabrication equipment using the design data to fabricate the devices described herein. Resulting products formed from the computer files include semiconductor wafers that are then cut into semiconductor die (e.g., the processor 101) and packaged, and may be further integrated into products including, but not limited to, mobile phones, smart phones, laptops, netbooks, tablets, ultrabooks, desktop computers, digital video recorders, set-top boxes, servers, and any other devices where integrated circuits are used.

In one aspect, the computer files form a design structure including the circuits described above and shown in the Figures in the form of physical design layouts, schematics, a hardware-description language (e.g., Verilog, VHDL, etc.). For example, design structure may be a text file or a graphical representation of a circuit as described above and shown in the Figures. Design process preferably synthesizes (or translates) the circuits described below into a netlist, where the netlist is, for example, a list of wires, transistors, logic gates, control circuits, I/O, models, etc. that describes the connections to other elements and circuits in an integrated circuit design and recorded on at least one of machine readable medium. For example, the medium may be a storage medium such as a CD, a compact flash, other flash memory, or a hard-disk drive. In another embodiment, the hardware, circuitry, and method described herein may be configured into computer files that simulate the function of the circuits described above and shown in the Figures when executed by a processor. These computer files may be used in circuitry simulation tools, schematic editors, or other software applications.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The previous description of the disclosed aspects is provided to enable a person skilled in the art to make or use the disclosed aspects. Various modifications to these aspects will be readily apparent to those skilled in the art, and the principles defined herein may be applied to other aspects without departing from the scope of the disclosure. Thus, the present disclosure is not intended to be limited to the aspects shown herein but is to be accorded the widest scope possible consistent with the principles and novel features as defined by the following claims.

What is claimed is:

1. A method, performed by a computer, for synthesizing computer machine instructions, comprising:
   selecting, based on an operation of a program, at least a first computer machine instruction and a second computer machine instruction from an instruction set of a processor;
   determining a first template of the first computer machine instruction, wherein the first template comprises zero or more first inputs and one or more first outputs of the first computer machine instruction;
   determining a second template of the second computer machine instruction, wherein the second template comprises zero or more second inputs and one or more second outputs of the second computer machine instruction;
   aggregating functionality of the first computer machine instruction and the second computer machine instruction to generate a third computer machine instruction designed to perform the operation;
   determining a third template of the third computer machine instruction based on the first template and the second template, wherein the third template indicates one or more relationships between:
      at least one of:
         the first inputs,
         the first outputs,
         the second inputs, or
         the second outputs,
      and
      at least one of:
         one or more third inputs of the third computer machine instruction, or
         one or more third outputs of the third computer machine instruction;
   and
      adding the third computer machine instruction to the instruction set of the processor.

2. The method of claim 1, wherein:
   the first computer machine instruction is designed to generate at least one first output;
   the third computer machine instruction is designed to generate the at least one first output generated by the first computer machine instruction; and
   the third template indicates that a third output is the at least one first output.

3. The method of claim 2, wherein:
   the first computer machine instruction is designed to generate the at least one first output based on at least one first input;
   the third computer machine instruction is designed to generate the at least one first output based on the at least one first input; and
   the third template indicates:
      a third input is the at least one first input, and
      a third output is the at least one first output.

4. The method of claim 2, wherein:
   the third computer machine instruction is designed to generate one or more of the at least one first outputs based on at least one third input; and
   the third template indicates that the at least one third input is a first input.

5. The method of claim 2, wherein:
   the third computer machine instruction is designed to generate one or more third outputs in addition to the at least one first output; and
   the third template indicates at least one of the third outputs differs from the at least one first output.

6. The method of claim 2, wherein:
   the first computer machine instruction is designed to generate one or more first outputs that are not used to generate third outputs; and
   the third template indicates the one or more first outputs that are not used to generate third outputs are not third inputs.

7. The method of claim 1, wherein:
   the first computer machine instruction is designed to generate at least one first output suitable for use as one of the second inputs;
   the second computer machine instruction is designed to generate, based on the one of the second inputs, at least one second output;
   the third computer machine instruction is designed to generate the at least one second output; and
   the third template indicates:
      the at least one first output suitable for use as one of the second inputs is the one of the second inputs, and
      the at least one second output is one of the third outputs.

8. The method of claim 7, wherein:
   the first computer machine instruction is designed to generate the at least one first output suitable for use as one of the second inputs based on at least one first input;
   the third computer machine instruction is designed to generate the at least one second output based on the at least one first input suitable for use as one of the second inputs; and
   the third template indicates the at least one first output suitable for use as one of the second inputs is one of the second inputs.

9. The method of claim 7, wherein:
the third computer machine instruction is designed to generate one or more of the second outputs based on at least one third input; and
the third template indicates each of one or more third outputs is one of the one or more second outputs.

10. The method of claim 7, wherein:
the third computer machine instruction is designed to generate one or more third outputs in addition to the at least one second output; and
the third template indicates one of the third outputs is different from the at least one second output.

11. The method of claim 7, wherein:
the first computer machine instruction is designed to generate one or more first outputs that are not used to generate third outputs; and
the third template indicates the one or more first outputs that are not used to generate third outputs are not third inputs.

12. An apparatus for synthesizing computer machine instructions, comprising:
a processor configured to:
select, based on an operation of a program, at least a first computer machine instruction and a second computer machine instruction from an instruction set of another processor,
determine a first template of the first computer machine instruction, wherein the first template comprises zero or more first inputs and one or more first outputs of the first computer machine instruction,
determine a second template of the second computer machine instruction, wherein the second template comprises zero or more second inputs and one or more second outputs of the second computer machine instruction,
aggregate functionality of the first computer machine instruction and the second computer machine instruction to generate a third computer machine instruction designed to perform the operation,
determine a third template of the third computer machine instruction based on the first template and the second template, wherein the third template indicates one or more relationships between:
at least one of:
the first inputs,
the first outputs,
the second inputs, or
the second outputs,
and
at least one of:
one or more third inputs of the third computer machine instruction, or
one or more third outputs of the third computer machine instruction;
and
add the third computer machine instruction to the instruction set of the other processor; and
a memory coupled with the processor.

13. The apparatus of claim 12, wherein:
the first computer machine instruction is designed to generate at least one first output;
the third computer machine instruction is designed to generate the at least one first output generated by the first computer machine instruction; and
the processor is configured to determine the third template by determining the third template indicates that a third output is the at least one first output.

14. The apparatus of claim 13, wherein:
the first computer machine instruction is designed to generate one or more of the first outputs based on at least one first input;
the third computer machine instruction is designed to generate the at least one first output based on the at least one first input; and
the processor is configured to determine the third template by determining the third template indicates:
a third input is the at least one first input, and
a third output is the at least one first output.

15. The apparatus of claim 13, wherein:
the third computer machine instruction is designed to generate one or more of the at least one first outputs based on at least one third input; and
the processor is configured to determine the third template by determining the third template indicates that the at least one third input is a first input.

16. The apparatus of claim 13, wherein:
the third computer machine instruction is designed to generate one or more third outputs in addition to the at least one first output; and
the processor is configured to determine the third template by determining the third template indicates at least one of the third outputs differs from the at least one first output.

17. The apparatus of claim 13, wherein:
the first computer machine instruction is designed to generate one or more outputs that are not used to generate third outputs; and
the processor is configured to determine the third template by determining the third template indicates the one or more first outputs that are not used to generate third outputs are not third inputs.

18. The apparatus of claim 13, wherein:
the first computer machine instruction is designed to generate at least one first output suitable for use as one of the second inputs;
the second computer machine instruction is designed to generate, based on the one of the second inputs, at least one second output;
the third computer machine instruction is designed to generate the at least one second output; and
the processor is configured to determine the third template by determining the third template indicates:
the at least one first output suitable for use as one of the second inputs is the one of the second inputs, and
the at least one second output is one of the third outputs.

19. The apparatus of claim 18, wherein:
the first computer machine instruction is designed to generate the at least one first output suitable for use as one of the second inputs based on at least one first input;
the third computer machine instruction is designed to generate the at least one second output based on the at least one first input suitable for use as one of the second inputs; and
the processor is configured to determine the third template by determining the third template indicates the at least one first output suitable for use as one of the second inputs is one of the second inputs.

20. The apparatus of claim 18, wherein:
the third computer machine instruction is designed to generate one or more of the second outputs based on at least one third input; and the processor is configured to determine the third template by determining the third template indicates each of one or more third outputs is one of the one or more second outputs.

21. The apparatus of claim 18, wherein:
the third computer machine instruction is designed to generate one or more third outputs in addition to the at least one second output; and
the processor is configured to determine the third template by determining the third template indicates one of the third outputs is different from the at least one second output.

22. The apparatus of claim 18, wherein:
the first computer machine instruction is designed to generate one or more first outputs that are not used to generate third outputs; and
the processor is configured to determine the third template by determining the third template indicates the one or more first outputs that are not used to generate third outputs are not third inputs.

23. An apparatus, comprising:
means for selecting, based on an operation of a program, at least a first computer machine instruction and a second computer machine instruction from an instruction set of a processor;
means for determining a first template of the first computer machine instruction, wherein the first template comprises zero or more first inputs and one or more first outputs of the first computer machine instruction;
means for determining a second template of the second computer machine instruction, wherein the second template comprises zero or more second inputs and one or more second outputs of the second computer machine instruction;
means for aggregating functionality of the first computer machine instruction and the second computer machine instruction to generate a third computer machine instruction designed to perform the operation; and
means for determining a third template of the third computer machine instruction based on the first template and the second template, wherein the third template indicates one or more relationships between:
at least one of:
the first inputs,
the first outputs,
the second inputs, or
the second outputs,
and
at least one of:
one or more third inputs of the third computer machine instruction, or
one or more third outputs of the third computer machine instruction;
and
means for adding the third computer machine instruction to the instruction set of the processor.

24. A non-transitory computer readable medium comprising instructions that, when executed by a processing system, cause the processing system to perform operations comprising:
selecting, based on an operation of a program, at least a first computer machine instruction and a second computer machine instruction from an instruction set of a processor;
determining a first template of the first computer machine instruction, wherein the first template comprises zero or more first inputs and one or more first outputs of the first computer machine instruction;
determining a second template of the second computer machine instruction, wherein the second template comprises zero or more second inputs and one or more second outputs of the second computer machine instruction;
aggregating functionality of the first computer machine instruction and the second computer machine instruction to generate a third computer machine instruction designed to perform the operation; and
determining a third template of the third computer machine instruction based on the first template and the second template, wherein the third template indicates one or more relationships between:
at least one of:
the first inputs,
the first outputs,
the second inputs, or
the second outputs,
and
at least one of:
one or more third inputs of the third computer machine instruction, or
one or more third outputs of the third computer machine instruction;
and
adding the third computer machine instruction to the instruction set of the processor.

25. The computer readable medium of claim 24, wherein:
the first computer machine instruction is designed to generate at least one first output;
the third computer machine instruction is designed to generate the at least one first output generated by the first computer machine instruction; and
the third template indicates that a third output is the at least one first output.

26. The computer readable medium of claim 25, wherein:
the first computer machine instruction is designed to generate the at least one first output based on at least one first input;
the third computer machine instruction is designed to generate the at least one first output based on the at least one first input; and
the third template indicates:
a third input is the at least one first input, and
a third output is the at least one first output.

27. The computer readable medium of claim 25, wherein:
the third computer machine instruction is designed to generate one or more of the at least one first outputs based on at least one third input; and
the third template indicates that the at least one third input is a first input.

28. The computer readable medium of claim 25, wherein:
the third computer machine instruction is designed to generate one or more third outputs in addition to the at least one first output; and
the third template indicates at least one of the third outputs differs from the at least one first output.

29. The computer readable medium of claim 25, wherein:
the first computer machine instruction is designed to generate one or more first outputs that are not used to generate third outputs; and
the third template indicates the one or more first outputs that are not used to generate third outputs are not third inputs.

30. The computer readable medium of claim 24, wherein:
the first computer machine instruction is designed to generate at least one first output suitable for use as one of the second inputs;
the second computer machine instruction is designed to generate, based on the one of the second inputs, at least one second output;
the third computer machine instruction is designed to generate the at least one second output; and
the third template indicates:
　the at least one first output suitable for use as one of the second inputs is the one of the second inputs, and
　the at least one second output is one of the third outputs.

\* \* \* \* \*